United States Patent [19]

Okunaka et al.

[11] 4,369,208
[45] Jan. 18, 1983

[54] PROCESS FOR PRODUCING TRANSPARENT ELECTROCONDUCTIVE FILM

[75] Inventors: Masaaki Okunaka, Fujisawa; Ryoichi Sudo, Yokosuka; Hitoshi Yokono, Yokohama; Tokio Isogai, Fujisawa; Mitsuo Yamazaki, Hitachi, all of Japan

[73] Assignees: Hitachi, Ltd.; Hitachi Chemical Company, Ltd., both of Tokyo, Japan

[21] Appl. No.: 215,334

[22] Filed: Dec. 11, 1980

[30] Foreign Application Priority Data

Dec. 14, 1979 [JP] Japan .............................. 54-161437

[51] Int. Cl.³ .............................................. B05D 3/06
[52] U.S. Cl. .................................. 427/54.1; 427/108; 427/126.2; 427/314; 427/383.1; 427/383.5
[58] Field of Search .................... 427/54.1, 108, 126, 427/383.1, 383.5, 314, 126.2

[56] References Cited

U.S. PATENT DOCUMENTS

| | | | |
|---|---|---|---|
| 4,098,922 | 7/1978 | Dinella et al. | 427/54.1 |
| 4,135,959 | 1/1979 | Luo et al. | 427/54.1 |
| 4,239,787 | 12/1980 | Rentschler | 427/54.1 |

*Primary Examiner*—John D. Smith
*Assistant Examiner*—Janyce A. Bell
*Attorney, Agent, or Firm*—Antonelli, Terry and Wands

[57] ABSTRACT

A transparent electroconductive film of lower resistance with a smaller content of remaining organic components and less pinholes than those of the conventional transparent electroconductive film is produced by applying a coating solution selected from (a) a coating solution comprising an inorganic indium compound free from a photosensitive group in the molecule or an inorganic tin compound free from a photosensitive group in the molecule, an organic ligand, and an organic solvent, (b) a coating solution comprising an organic indium compound free from a photosensitive group in the molecule, or an organic tin compound free from a photosensitive group in the molecule, and an organic solvent, and (c) the coating solution (a) or (b) further containing a dopant to the surface of a substrate, thereby forming a film thereon, and then irradiating the substrate with radiation capable of exciting organic groups, for example, ultraviolet rays in a state where the substrate is kept at a high temperature (100°–600° C.), and then baking the substrate at a high temperature.

5 Claims, 6 Drawing Figures

4,369,208

PROCESS FOR PRODUCING TRANSPARENT ELECTROCONDUCTIVE FILM

BACKGROUND OF THE INVENTION

FIELD OF THE INVENTION

This invention relates to a process for producing a transparent electroconductive film on the surface of a substrate of, for example, glass, ceramics, etc., and more particularly to a process for producing a transparent electroconductive film of lower resistance with a smaller content of remaining organic components and less pinholes than those of the conventional transparent electroconductive film, which comprises applying a coating solution selected from (a) a coating solution comprising an inorganic indium compound free from a photosensitive group in the molecule or an inorganic tin compound free from a photosensitive group in the molecule, an organic ligand capable of complexing with metal such as indium or tin, and an organic solvent, (b) a coating solution comprising an organic indium compound free from a photosensitive group in the molecule, or an organic tin compound free from a photosensitive group in the molecule, and an organic solvent, and (c) the coating solution (a) or (b) further containing a dopant source or precursor to the surface of a substrate, thereby forming a film thereon, irradiating the substrate with irradiation capable of exciting organic groups, for example, ultraviolet rays in a state where the substrate is kept at a high temperature (100°–600° C.), and then baking the substrate at a high temperature.

Electrodes having a light transparency are used in display element such as liquid crystal display elements, plasma display elements, electroluminescence display elements, etc., photosensitive display elements such as photocells, solar battery, etc., anti-dew glass, etc.

Heretofore, (1) vacuum vapor deposition process, (2) a sputtering process, (3) a CVD process, (4) a hot spray process, (5) a coating process, etc. have been known for producing a transparent electroconductive film. According to the processes (1) and (2), a film of lower resistance with good transparency can be produced, but the apparatus is expensive and is hard to apply to a substrate with a large area. The processes are also batch-wise and thus are not suitable for mass production. The processes (3) and (4) have such a disadvantage that a transparent electroconductive film with a uniform film quality is hard to produce on a substrate with a large area. On the other hand, the process (5) can produce a transparent electroconductive film uniformly on a substrate with a large area.

Typical of the coating process (5) are a process (a) of heat-setting a film of heat-setting type, followed by baking, and a process (b) of setting a film of ultraviolet setting type by means of ultraviolet rays, followed by baking. However, the resistance of transparent electroconductive films obtained according to these processes (a) and (b) is 500 Ω/□ at the lowest for a film thickness of 1,000 Å.

SUMMARY OF THE INVENTION

An object of the present invention is to provide a transparent electroconductive film of lower resistance than 500 Ω/□, preferably a resistance of 400 Ω/□, for a film thickness of 1,000 Å, free from the disadvantages of the conventional art.

In the present invention, a transparent, dense electroconductive film of lower resistance with a smaller amount of remaining organic components and less pinholes than those of the conventional transparent electroconductive film can be obtained by applying a coating solution selected from (a) a coating solution comprising an inorganic indium compound free from a photosensitive group in the molecule, or an inorganic tin compound free from a photosensitive group in the molecule, an organic ligand capable of complexing with indium or tin, and an organic solvent, (b) a coating solution comprising an organic indium compound free from a photosensitive group in the molecule, or an organic tin compound free from a photosensitive group in the molecule, and an organic solvent, and (c) the coating solution (a) or (b) further containing a dopant source, to the surface of a substrate, thereby forming a film thereon, irradiating the substrate with radiation capable of exciting organic groups in the film, for example, ultraviolet rays in a state where the substrate is kept at a high temperature (100°–600° C.) and then baking the substrate. Various modes of irradiation are applicable, for example, (a) the irradiation and heating for keeping the substrate at a high temperature are carried out and finished at the same time, (b) the irradiation is started before heating for keeping the substrate at a high temperature and finished after the heating is finished, (c) the irradiation is started before heating for keeping the substrate at a high temperature and continued till the end of heating, (d) the irradiation is started after heating for keeping the substrate at a high temperature has been started and finished before the end of heating, (e) the irradiation is started before the heating for keeping the substrate at a high temperature is started and finished before the end of heating, etc. Choice of the mode of irradiation depends upon the temperature at which a substrate is to be kept.

When the film is dried at 55°–300° C. after any one of the coating solutions (a)–(c) has been applied to the surface of a substrate, the film is not changed in quality by moisture absorption even if it is left standing in the atmosphere for 2–3 hours, and an excellent transparent electroconductive film can be obtained. That is, the drying can reduce rejection ratio in mass production.

Description will be made below of materials to be used in the present invention.

The indium compound to be used for producing a transparent electroconductive film comprising indium oxide is at least one compound selected from inorganic indium compounds such as indium chloride, indium nitrate, indium perchlorate, etc., and their hydrates, and organic indium compounds obtained by reaction of indium with organic compounds i.e., ligands including carboxylic acids such as 2-ethylhexanoic acid, propionic acid, oxalic acid, malonic acid, succinic acid, glutaric acid, adipic acid, pimelic acid, suberic acid, azelaic acid, sebacic acid, maleic acid, fumaric acid, citraconic acid, mesaconic acid, itaconic acid, methylmalonic acid, methylsuccinic acid, hexahydrophthalic acid, methyltetrahydrophthalic acid, glycolic acid, lactic acid, hydroacrylic acid, α-hydroxy-n-butyric acid, α-hydroxyisobutyric acid, β-hydroxy-n-butyric acid, γ-hydroxybutyric acid, 3-hydroxyglutaric acid, 3-hydroxy-3-methylglutaric acid, leucinic acid, tartronic acid, glyceric acid, malic acid, oxalacetic acid, citric acid, tartaric acid, gluconic acid, 3-hydroxy-3-phenylpropionic acid, hydroxyphenylacetic acid, etc., or their intermolecular or intramolecular esters or anhydrides, or β-diketones such as acetylacetone, dipivaloylmethane, ethylacetoacetate, hexane-2,4-dion, 1-methyl-pentane-2,4-dion, heptane-3,5-dion, and (C₂H₅O)₃In, C₂H₅OIn(CH₃)₂,

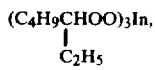

indium naphthenate, etc.

Tin compound to be used as a dopant source for reducing the resistance of a transparent electroconductive film comprising indium oxide, or the tin compound to be used for producing a transparent electroconductive film comprising tin oxide includes tin compounds such as SnCl₄.5H₂O, Sn(OCOC₉H₁₅)₂, (C₄H₉)₂Sn(OCOCH₃)₂, (C₄H₉)₂Sn(OCOCH=CH-COO), (C₄H₉)₂Sn(OCOC₁₁H₂₃)₂, (C₄H₉)₂Sn(OCOCH=CHCOOC₂H₅)₂, (C₄H₉)₂Sn[OCOC(CH₃)=CH₂]₂, Sn(OC₂H₅)₄, Sn(OC₃H₇)₄, (CH₃)₂SnCl₂, C₄H₉SnOOH, CH₃SnOOH, (C₄H₉)₃SnF, (C₄H₉)₃SnCl, etc. Those obtained by dissolving metallic tin in an inorganic acid such as nitric acid, etc. can be also used. These tin compounds can be used alone or in combination thereof.

Antimony compound to be used as a dopant source for reducing the resistance of a transparent electroconductive film comprising tin oxide includes (C₆H₅)₃Sb, (p. CH₃C₆H₄)₃Sb, (C₆H₅)SbCl₂, (C₂H₅)₃Sb, (tert-C₄H₉)₂SbCl, (C₂H₅)₃SbCl₂, (CH₃)₃Sb(OCOCH₃)₂, (CH₃)₂Sb(OCOCH₃)₃,

SbCl₃, Sb(OC₂H₅)₃, etc. The antimony compounds can be used alone or in combination thereof.

The organic solvent includes methanol, ethanol, isopropanol, methylcellosolve, ethylcellosolve, butylcellosolve, ethyleneglycol, propyleneglycol, diethyleneglycol, ethylcarbitol, N-methylpyrrolidone, dimethyl sulfoxide, etc. The organic solvents can be used alone or in combination thereof. A mixing proportion of the indium compound to be used for producing a transparent electroconductive film comprising indium oxide or the tin compound to be used for producing a transparent electroconductive film comprising tin oxide to the organic solvent is appropriately 2–80% by weight.

The ligand to be complexed with the metal includes carboxylic acids such as 2-ethylhexanoic acid, propionic acid, oxalic acid, malonic acid, succinic acid, glutaric acid, adipic acid, pimelic acid, suberic acid, azelaic acid, sebacic acid, maleic acid, fumaric acid, citraconic acid, mesaconic acid, itaconic acid, methylmalonic acid, methylsuccinic acid, hexahydrophthalic acid, methyltetrahydrophthalic acid, glycolic acid, lactic acid, hydroacrylic acid, α-hydroxy-n-butyric acid, α-hydroxyisobutyric acid, β-hydroxy-n-butyric acid, γ-hydroxybutyric acid, 3-hydroxyglutaric acid, 3-hydroxy-3-methylglutaric acid, leucinic acid, tartronic acid, glyceric acid, malic acid, oxalacetic acid, citric acid, tartaric acid, gluconic acid, 3-hydroxy-3-phenylpropionic acid, hydroxyphenylacetic acid, etc., or their intermolecular or intramolecular esters or anhydrides, and β-diketones such as acetylacetone, dipivaloylmethane, ethylacetacetate, hexane-2,4-dion, 1-methyl-pentane-2,4-dion, heptane-3,5-dion, etc., and the ligands can be used alone or in combination thereof. A mixing ratio by mole of the ligand to the inorganic indium compound or the inorganic tin compound is 0.2–3.0:1.

The dopant source is added to the coating solution (a) or (b) in a desired amount, depending upon the desired resistance.

As a lamp for ultraviolet irradiation, a high pressure mercury lamp, a metal halide lamp, etc. can be used. The lamp emits strong light with wavelength 254 nm, 297 nm, 313 nm, 365 nm, 406 nm, 436 nm, 545 nm, and 578 nm, and weak light with wavelength 220–400 nm, and the film is also heated thereby. An ultraviolet lamp with an output of 40–16 W/cm is particularly effective. A light-reflecting plate can be used for efficiently utilizing the light from the ultraviolet lamp. The shape of the light-reflecting plate is determined according to the mode of light reflection, that is, reflected light collection or parallel light reflection. The longer the distance between a lamp and a substrate, the smaller the light quantity on the substrate. The shorter the distance, the more uneven the distribution of the light quantity on the substrate. This can be however improved by adjusting the shape of the light-reflecting plate, etc. The substrate can be transported by a conveyer, and irradiated by ultraviolet rays on the travelling conveyer to give an in-line system. It is necessary that the substrate peak temperature during the ultraviolet irradiation is 450° C. at maximum, and preferably 180°–450° C. In that case, the substrate can be heated by a heater, infrared rays, etc. at the ultraviolet irradiation.

It is preferable to bake the substrate at 300°–600° C. after the ultraviolet irradiation. If the baking is carried out below 300° C., the indium compound, tin compound, and antimony compound are not completely converted to their oxides. If the baking is carried out above 600° C. on the other hand, the substrate undergoes bending or curving, or cracking.

DESCRIPTION OF THE PREFERRED EMBODIMENTS

EXAMPLE 1

Figure 1:
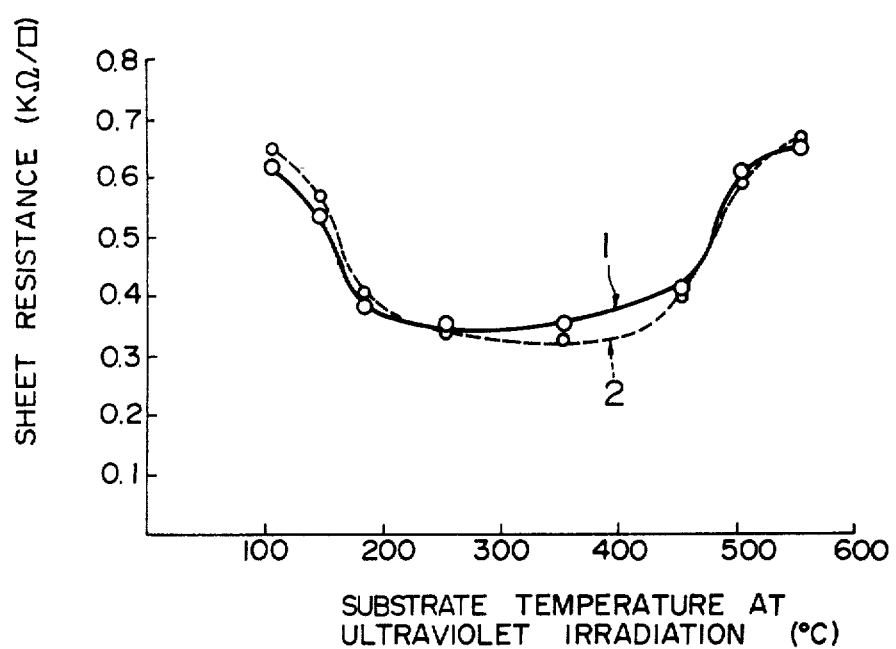
FIGS. 1–6 are diagrams showing data for illustrating embodiments of the present invention.

Typical compositions of coating solution for producing a transparent electroconductive film of indium oxide system are shown in Table 1. Nos. 1–21.

Predetermined amounts of indium compound, ligand and solvent were weighed out, mixed together and stirred at room temperature for a few hours to make a uniform solution.

A tin compound was weighed out and added to the solution. The solution was further stirred at room temperature for about one hour to make a coating solution. The coating solution was applied to a glass substrate by means of a spinner coater at 4,000 rpm, and the resulting film was irradiated with ultraviolet rays, using an ultraviolet lamp of metal halide with an output of 120 W/cm. The distance between the lamp and the substrate was 10 cm. The ultraviolet intensity on the substrate was 230 mW/cm² (wavelength: 365 nm). The irradiation time was 60 seconds. Then, the substrate was baked at 500° C. for one hour, whereby a transparent electroconductive film with a thickness of 1,000 Å was obtained.

As shown in Table 1, Nos. 1–21, the transparent electroconductive films produced from any of the compositions by ultraviolet irradiation and successive baking had a lower resistance than that of the films produced by drying in a thermostat tank and successive baking.

EXAMPLE 2

A film was formed on a glass substrate, using the coating solution of Table 1, No. 4 in the same manner as in Example 1, and then irradiated with ultraviolet rays, using an ultraviolet lamp with 120 W/cm at a distance of 10 cm between the lamp and the substrate for 60 seconds. At that time, the substrate temperature was

TABLE 1

| | Solution composition and resistance | | | | Sheet resistance (kΩ/□) | | |
|---|---|---|---|---|---|---|---|
| | Solution | | | | | No UV | |
| No. | Indium compound (mol) | Tin compound (mol) | Ligand (mol) | Solvent (g) | UV irradiation (A) | irradiation (B) | A/B |
| 1 | $In(NO_3)_3.3H_2O$ (1) | $Sn(OCOC_7H_{15})_2$ (0.10) | Citraconic acid (0.5) | Ethylcellosolve (1200) | 0.28 | 0.54 | 0.52 |
| 2 | $In(NO_3)_3.3H_2O$ (1) | $Sn(OCOC_7H_{15})_2$ (0.05) | Citraconic acid (0.5) | Ethylcellosolve (1200) | 0.47 | 0.89 | 0.53 |
| 3 | $In(NO_3)_3.3H_2O$ (1) | $Sn(OCOC_7H_{15})_2$ (0.15) | Citraconic acid (0.5) | Ethylcellosolve (1200) | 0.41 | 0.75 | 0.55 |
| 4 | $In(NO_3)_3.3H_2O$ (1) | $Sn(OCOC_7H_{15})_2$ (0.10) | Citraconic acid (0.3) | Ethylcellosolve (1200) | 0.32 | 0.71 | 0.45 |
| 5 | $In(NO_3)_3.3H_2O$ (1) | $Sn(OCOC_7H_{15})_2$ (0.10) | Citraconic acid (1.0) | Ethylcellosolve (1200) | 0.38 | 0.63 | 0.61 |
| 6 | $In(NO_3)_3.3H_2O$ (1) | $Sn(OCOC_7H_{15})_2$ (0.10) | Citraconic acid (0.5) | Ethylcarbitol (1,200) | 0.30 | 0.57 | 0.53 |
| 7 | $In(NO_3)_3.3H_2O$ (1) | $Sn(OCOC_7H_{15})_2$ (0.10) | Citraconic acid (0.5) | Ethyleneglycol (1,200) | 0.32 | 0.60 | 0.54 |
| 8 | $In(NO_3)_3.3H_2O$ (1) | $Sn(OCOC_7H_{15})_2$ (0.10) | Succinic acid (0.5) | Ethylcellosolve (1,200) | 0.63 | 0.83 | 0.76 |
| 9 | $In(NO_3)_3.3H_2O$ (1) | $Sn(OCOC_7H_{15})_2$ (0.10) | Adipic acid (0.5) | Ethylcellosolve (1,200) | 1.03 | 1.41 | 0.73 |
| 10 | $In(NO_3)_3.3H_2O$ (1) | $Sn(OCOC_7H_{15})_2$ (0.10) | Maleic acid (0.5) | Ethylcellosolve (1,200) | 0.26 | 0.51 | 0.51 |
| 11 | $In(NO_3)_3.3H_2O$ (1) | $Sn(OCOC_7H_{15})_2$ (0.10) | Mesaconic acid (0.5) | Ethylcellosolve (1,200) | 0.28 | 0.54 | 0.52 |
| 12 | $In(NO_3)_3.3H_2O$ (1) | $Sn(OCOC_7H_{15})_2$ (0.10) | Monoethyl succinate (0.5) | Ethylcellosolve (1,200) | 0.44 | 1.13 | 0.63 |
| 13 | $In(NO_3)_3.3H_2O$ (1) | $Sn(OCOC_7H_{15})_2$ (0.10) | Citric acid (0.5) | Ethylcellosolve (1,200) | 0.56 | 0.92 | 0.61 |
| 14 | $In(NO_3)_3.3H_2O$ (1) | $SnCl_3.3H_2O$ (0.10) | Citraconic acid (0.5) | Ethylcellosolve (1,200) | 1.13 | 1.58 | 0.72 |
| 15 | $In(NO_3)_3.3H_2O$ (1) | $(C_4H_9)_2Sn(OCOCH= CHCOOC_2H_5)_2$ (0.10) | Citraconic acid (0.5) | Ethylcellosolve (1,200) | 1.04 | 1.43 | 0.73 |
| 16 | $In(NO_3)_3.3H_2O$ (1) | $Sn(OC_2H_5)_4$ (0.10) | Citraconic acid (0.5) | Ethylcellosolve (1,200) | 1.15 | 1.57 | 0.73 |
| 17 | $In(ClO_4)_3.8H_2O$ (1) | $Sn(OCOC_7H_{15})_2$ (0.10) | Citraconic acid (0.5) | Ethylcellosolve (1,200) | 0.33 | 0.53 | 0.62 |
| 18 | $In(ClO_4)_3.8H_2O$ (1) | $Sn(OCOC_7H_{15})_2$ (0.10) | Succinic acid (0.5) | Ethylcellosolve (1,200) | 0.76 | 0.94 | 0.81 |
| 19 | $InCl_3.4H_2O$ (1) | $Sn(OCOC_7H_{15})_2$ (0.10) | Citraconic acid (0.5) | Ethylcellosolve (1,200) | 0.57 | 0.94 | 0.61 |
| 20 | $InCl_3.4H_2O$ (1) | $Sn(OCOC_7H_{15})_2$ (0.10) | Succinic acid (0.5) | Ethylcellosolve (1,200) | 1.42 | 1.67 | 0.85 |
| 21 | $In(OCOC_7H_{15})_3$ (1) | $Sn(OCOC_7H_{15})_2$ (0.10) | — | Ethylcellosolve (1,200) | 0.53 | 0.65 | 0.82 | changed in a range of 100°–550° C. by the heat at irradiation and by heating.

Then, the substrate was baked at 500° C. for one hour, whereby a transparent electroconductive film with a thickness of 1,000 Å was obtained. The sheet resistance of the resulting transparent electroconductive film is shown by curve 1 in FIG. 1, from which it is seen that the resistance was less than 500 Ω/□ at a substrate temperature of 150°–475° C. at the ultraviolet irradiation, and less than 400 Ω/□ at 180°–450° C. The effect of ultraviolet irradiation was observed in other temperature range than the aforementioned ranges.

EXAMPLE 3

Figure 2:
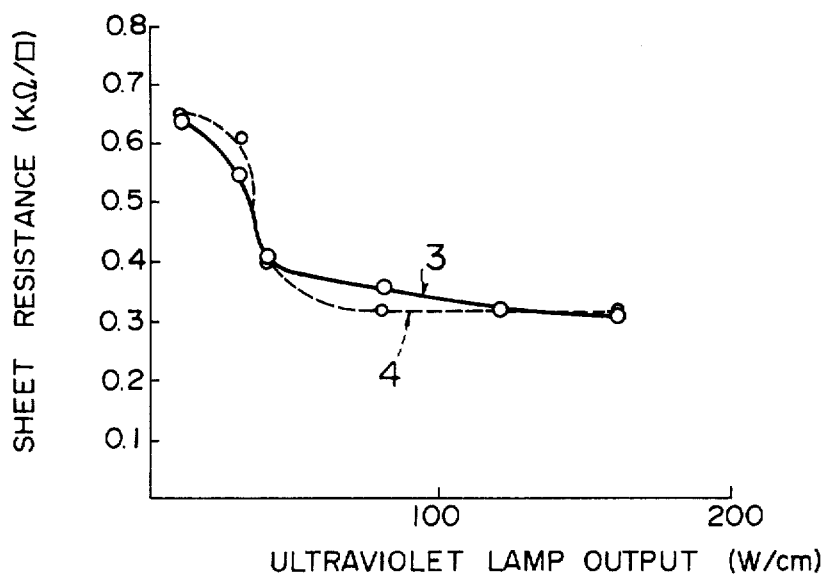

A film was formed on a glass substrate, using the coating solution of Table 1, No. 4 in the same manner as in Example 1, and then irradiated with ultraviolet rays from an ultraviolet lamp for 60 seconds while changing the output of the ultraviolet lamp in a range of 10 to 160 W/cm and keeping the distance between the lamp and the substrate at 10 cm. The substrate temperature at the irradiation was 350° C. Then, the substrate was baked at 500° C. for one hour, whereby a transparent electroconductive film with a thickness of 1,000 Å was obtained. Sheet resistance of the resulting transparent electroconductive film is shown by curve 3 in FIG. 2, from which it is seen that the resistance is less than 500 Ω/□ at the output of the ultraviolet lamp of 34 W/cm or higher, and less than 400 Ω/□ at 40 W/cm or higher, and that practically 34–160 W/cm is preferable. In any case, the ultraviolet irradiation was effective, but the effect is particularly remarkable at 40 W/cm or higher.

EXAMPLE 4

Figure 3:
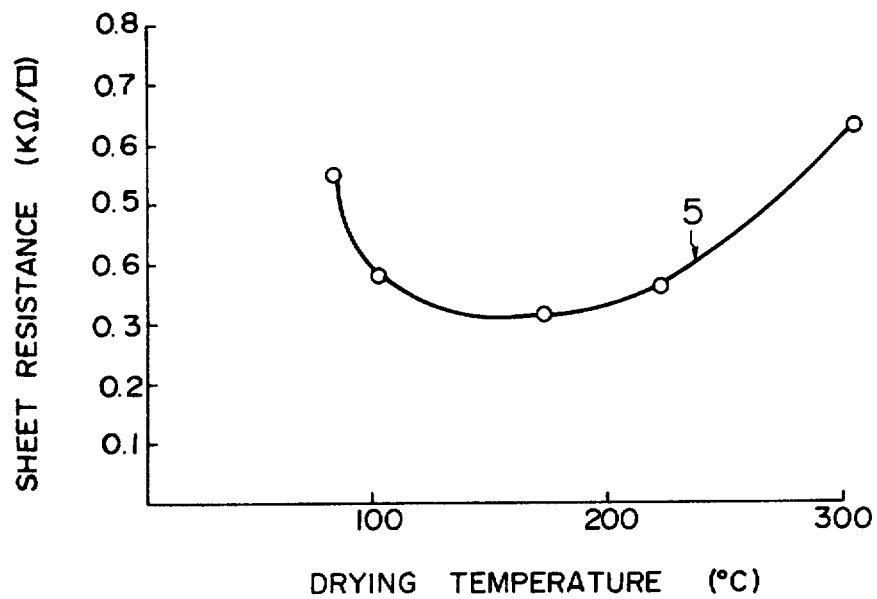

The coating solution of Table 1, No. 4 was applied to a glass plate in the same manner as in Example 1, and the resulting film was dried in a temperature range of 80°–300° C. for ten minutes, and then irradiated with ultraviolet rays from an ultraviolet lamp with an output of 120 W/cm for 60 seconds while keeping the distance between the lamp and the substrate at 10 cm. The substrate temperature at the irradiation was 350° C. Then, the substrate was baked at 500° C. for one hour, whereby a transparent electroconductive film with a thickness of 1,000 Å was obtained. Sheet resistance of the resulting transparent electroconductive film is shown by curve 5 in FIG. 3, from which it is seen that the resistance is 500 Ω/□ at any drying temperature between 85° and 268° C., and 400 Ω/□ or less between 100° and 235° C., and the ultraviolet irradiation was effective.

EXAMPLE 5

A dried film was formed on a glass substrate in the same manner as in Example 4 by drying the film at 170° C. for 10 minutes, and then irradiated with ultraviolet rays from an ultraviolet lamp with an output of 120 W/cm for 60 seconds while keeping the distance between the lamp and the substrate at 10 cm. The substrate temperature was in a range of 100°–550° C. Then, the substrate was baked at 500° C. for one hour, whereby a transparent electroconductive film with a thickness of 1,000 Å was obtained. Sheet resistance of the resulting transparent electroconductive film is shown by curve 2 in FIG. 1, from which it is seen that the ultraviolet irradiation is effective at any substrate temperature, and the resistance is less than 500 Ω/□ at a substrate temperature of 150°–475° C. and less than 400 Ω/□ at 180°–450° C., as in the case of no drying step in Example 2.

EXAMPLE 6

A dried film was formed on a glass substrate in the same manner as in Example 5, and then irradiated with ultraviolet ray from an ultraviolet lamp with an output of 10–160 W/cm for 60 seconds while keeping the distance between the lamp and the substrate at 10 cm. The substrate temperature at the irradiation was 350° C. Then, the substrate was baked at 500° C. for one hour, whereby a transparent electroconductive film with a thickness of 1,000 Å was obtained. Sheet resistance of the resulting transparent electroconductive film is shown by curve 4 in FIG. 2, from which it is seen that the ultraviolet irradiation is effective with any of outputs of the ultraviolet lamp, and the resistance is less than 500 Ω/□ with the lamp output of 34 W/cm or higher, and less than 400 Ω/□ with 40 W/cm or higher, and that practically 34–160 W/cm is preferable.

EXAMPLE 7

Typical compositions of coating solution for producing a transparent electroconductive film of tin oxide system are shown in Table 2, Nos. 22–31. Predetermined amounts of tin compound and solvent were weighed out, mixed and dissolved, and then a predetermined amount of antimony compound was added to the resulting solution, and dissolved therein by stirring. Transparent electroconductive films with a thickness of 1,000 Å were formed on glass substrates, using the resulting coating solutions in the same manner as in Example 1. Sheet resistance of the resulting transparent electroconductive films is shown in Table 2, Nos. 22–31, from which it is seen that the transparent electroconductive films formed from any of the coating solutions by ultraviolet irradiation and successive baking had a lower resistance than that of the films formed therefrom by drying in a thermostat tank and successive baking.

TABLE 2

| | Liquid composition and resistance | | | | | |
|---|---|---|---|---|---|---|
| | Solution composition | | | Sheet resistance (kΩ/□) | | |
| No. | Tin compound (mol) | Antimony compound (mol) | Solvent (g) | UV irradiation (A) | No UV irradiation (B) | A/B |
| 22* | SnCl$_4$.5H$_2$O (1) | (C$_6$H$_5$)$_3$Sb (0.05) | Ethylcellosolve (1000) | 2.6 | 5.3 | 0.49 |
| 23 | Sn(OCOC$_7$H$_{15}$)$_2$ (1) | (C$_6$H$_5$)$_3$Sb (0.05) | Ethylcellosolve (1000) | 1.0 | 3.5 | 0.29 |
| 24 | Sn(OC$_2$H$_5$)$_4$ (1) | (C$_6$H$_5$)$_3$Sb (0.05) | Ethanol (900) | 2.1 | 4.2 | 0.50 |
| 25 | (C$_4$H$_9$)$_2$Sn(OCOCH$_3$)$_2$ (1) | (C$_6$H$_5$)$_3$Sb (0.05) | Ethylcarbitol (1000) | 1.9 | 5.1 | 0.42 |

TABLE 2-continued

| | Liquid composition and resistance | | | | | |
|---|---|---|---|---|---|---|
| | Solution composition | | | Sheet resistance (kΩ/□) | | |
| No. | Tin compound (mol) | Antimony compound (mol) | Solvent (g) | UV irradiation (A) | No UV irradiation (B) | A/B |
| 26 | $(C_4H_9)_2Sn(OCOC_{11}H_{23})_2$ (1) | $(C_6H_5)_3Sb$ (0.05) | Ethylcarbitol (1000) | 2.1 | 5.9 | 0.36 |
| 27 | $(C_4H_9)SnOOH$ (1) | $(C_6H_5)_3Sb$ (0.05) | Ethylcellosolve (750) | 1.8 | 4.7 | 0.38 |
| 28 | $Sn(OCOC_7H_{15})_2$ (1) | $SbCl_3$ (0.05) | Ethylcellosolve (1000) | 1.5 | 4.2 | 0.36 |
| 29 | $Sn(OCOC_7H_{15})_2$ (1) | $Sb(OC_2H_5)_3$ (0.05) | Ethylcellosolve (1000) | 1.3 | 4.5 | 0.29 |
| 30 | $Sn(OCOC_7H_{15})_2$ (1) | $(CH_3)_3Sb(OCOCH_3)_2$ (0.05) | Ethylcellosolve (1000) | 1.1 | 3.9 | 0.28 |
| 31 | $Sn(OCOC_7H_{15})_2$ (1) | $(C_2H_5)_3SbCl_2$ (0.05) | Ethylcellosolve (1000) | 1.4 | 4.4 | 0.32 |

*0.5 mol of citraconic acid added as ligand

EXAMPLE 8

Figure 4:
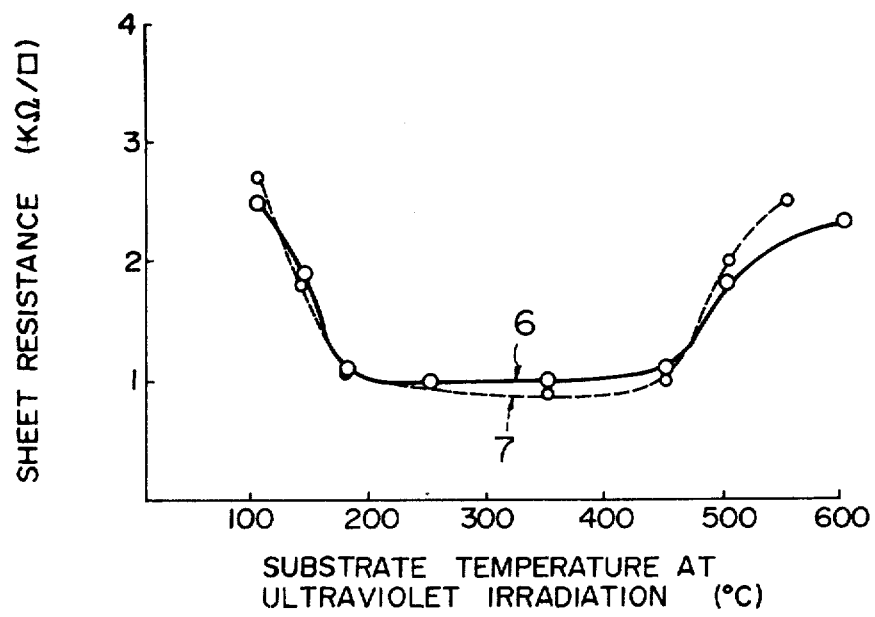

A transparent electroconductive film with a thickness of 1,000 Å was formed on a glass substrate, using the coating solution of Table 2, No. 23 in the same manner as in Example 2, and sheet resistance of the resulting transparent electroconductive film is shown by curve 6 in FIG. 4, from which it is seen that the ultraviolet irradiation is effective at any of the substrate temperatures of 100°–600° C., and the effect is particularly remarkable at 180°–450° C.

EXAMPLE 9

Figure 5:
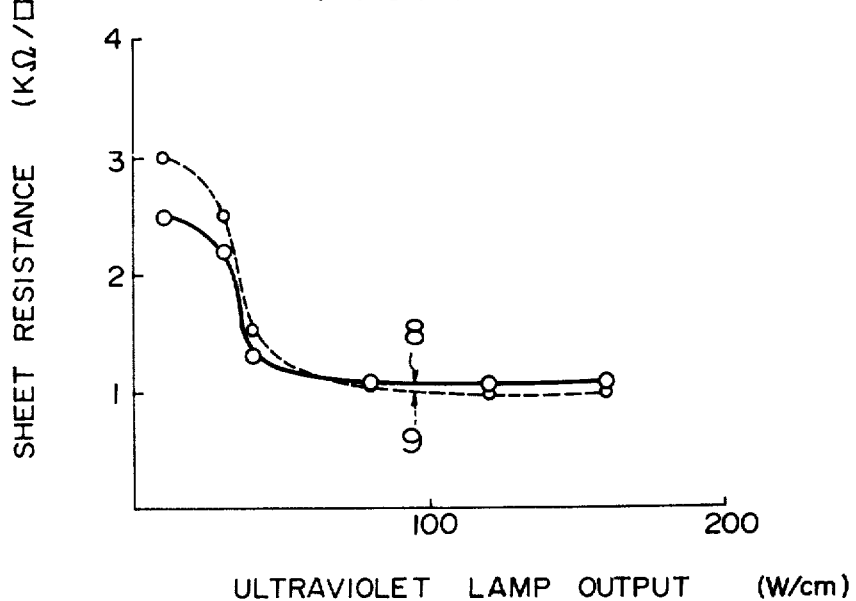

A transparent electroconductive film with a thickness of 1,000 Å was formed on a glass substrate, using the coating solution of Table 2, No. 23 in the same manner as in Example 3. Sheet resistance of the resulting transparent electroconductive film is shown by curve 8 in FIG. 5, from which it is seen that the ultraviolet irradiation is effective with the lamp output of 10 W/cm or higher, and the effect is particularly remarkable with the output of 40 W/cm, or higher, practically 40–160 W/cm.

EXAMPLE 10

Figure 6:
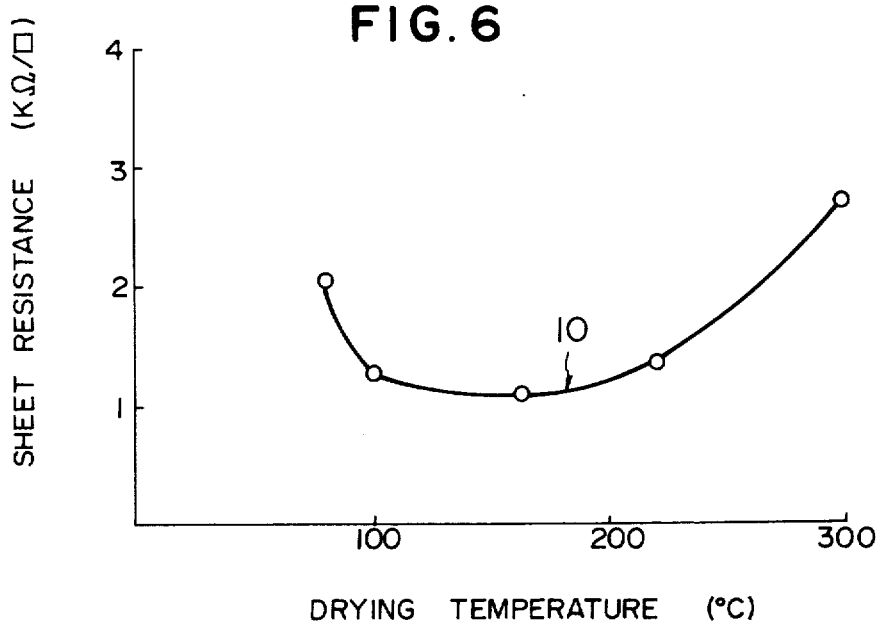

A transparent electroconductive film with a thickness of 1,000 Å was formed on a glass substrate, using the coating solution of Table 2, No. 23 in the same manner as in Example 4. Sheet resistance of the resulting transparent electroconductive film is shown by curve 10 in FIG. 6, from which it is seen that the ultraviolet irradiation is effective at any of drying temperatures of 85°–300° C., and the effect is particularly effective at a drying temperature of 100°–220° C.

EXAMPLE 11

A transparent electroconductive film with a thickness of 1,000 Å was formed on a glass substrate, using the coating solution of Table 2, No. 23 in the same manner as in example 5. Sheet resistance of the resulting transparent electroconductive film is shown by curve 7 in FIG. 4, from which it is seen that the ultraviolet irradiation is effective at any of substrate temperatures of 100°–550° C., and the effect is particularly effective at a substrate temperature of 180°–450° C.

EXAMPLE 12

A transparent electroconductive film with a thickness of 1,000 Å was formed on a glass substrate, using the coating solution of Table 2, No. 23 in the same manner as in Example 6. Sheet resistance of the resulting transparent electroconductive film is shown by curve 9 in FIG. 5, from which it is seen that the ultraviolet irradiation is effective with lamp output of 10 W/cm or higher, and the effect is particularly remarkable with 40 W/cm or higher, and practically 40–160 W/cm.

Comparative Example

Films were formed on glass substrates, using coating solutions of Table 1, Nos. 1–21 and Table 2, Nos. 22–31 in the same manner as in Example 1, and dried in a thermostat tank at 130° C. for 10 minutes. Then, the substrates were baked at 500° C. for one hour to produce transparent electroconductive films. Sheet resistances of the resulting transparent electroconductive films are shown in Tables 1 and 2, from which it is seen that the resistance of the transparent electroconductive films thus produced is all larger than that of the films produced according to the examples of the present invention.

What is claimed is:

1. A process for producing a transparent electroconductive film, which comprises applying a coating solution selected from (a) a coating solution comprising an inorganic indium compound free from a photosensitive group in the molecule, or an inorganic tin compound free from a photosensitive group in the molecule, an organic compound capable of providing a ligand to complex indium or tin, and an organic solvent, (b) a coating solution comprising an organic indium compound free from a photosensitive group in the molecule, or an organic tin compound free from a photosensitive group in the molecule, and an organic solvent, and (c) the coating solution (a) or (b) further containing a dopant source, to a glass substrate, thereby forming a film thereon, immediately thereafter irradiating the film and the substrate with radiation capable of exciting organic groups, at a substrate temperature of 100°–600° C. and then baking the substrate at a high temperature of from 300° to 600° C.

2. A process for producing a transparent electroconductive film, which comprises applying a coating solution selected from (a) a coating solution comprising an inorganic indium compound free from a photosensitive group in the molecule, or an inorganic tin compound free from a photosensitive group in the molecule, an organic compound capable of providing a ligand to complex indium or tin, and an organic solvent, and (c) the coating solution (a) or (b) further containing a dopant source, to a glass substrate, thereby forming a film thereon, and drying the film at a temperature from 55° to 300° C., irradiating the glass substrate with radiation capable of exciting organic groups at a substrate temperature of 100° to 600° C., and then baking the substrate at a high temperature of from 300° to 600° C.

3. A process according to claim 1 or 2, wherein the radiation capable of exciting organic groups is ultraviolet rays.

4. A process according to claim 2, wherein the film is dried at 85°–300° C.

5. A process according to claim 1 or 2, wherein:
(a) the inorganic indium compound free from a photosensitive group in the molecule is at least one compound selected from indium chloride, indium nitrate, indium perchlorate, and their hydrates,
(b) the inorganic tin compound free from a photosensitive group in the molecule is at least one compound selected from $SnCl_4.5H_2O$, and metallic tin dissolved in an inorganic acid,
(c) the organic ligand is at least one compound selected from 2-ethylhexanoic acid, propionic acid, oxalic acid, malonic acid, succinic acid, glutaric acid, adipic acid, pimelic acid, suberic acid, azelaic acid, sebacic acid, maleic acid, fumaric acid, citraconic acid, mesaconic acid, itaconic acid, methylmalonic acid, methylsuccinic acid, hexahydrophthalic acid, methyltetrahydrophthalic acid, glycolic acid, lactic acid, hydroacrylic acid, α-hydroxy-n-butyric acid, α-hydroxyisobutyric acid, β-hydroxy-n-butyric acid, γ-hydroxybutyric acid, 3-hydroxyglutaric acid, 3-hydroxy-3-methylglutaric acid, leucinic acid, tartronic acid, glyceric acid, malic acid, oxalacetic acid, citric acid, tartaric acid, glyconic acid, 3-hydroxy-3-phenylpropionic acid, hydroxyphenylacetic acid or their intermolecular or intramolecular esters or anhydrides, acetylacetone, dipivaloylmethane, ethylacetacetate, hexane-2,4-dion, 1-methylpentane-2,4-dion and heptane-3,5-dion, the compound being in a mixing proportion of 0.2–3.0 moles to one mole of the inorganic indium compound (a) or the inorganic tin compound (b),
(d) the organic solvent is at least one solvent selected from methanol, ethanol, isopropanol, methylcellosolve, ethylcellosolve, butylcellosolve, ethyleneglycol, propyleneglycol, diethyleneglycol, ethylcarbitol, N-methylpyrrolidone, and dimethylsulfoxide, the solvent being in a mixing proportion of 80–2% by weight to 20–98% by weight of the inorganic indium compound (a) or the inorganic tin compound (b),
(e) the organic indium compound free from a photosensitive group in the molecule is at least one compound selected from the reaction products with indium of 2-ethylhexanoic acid, propionic acid, oxalic acid, malonic acid, succinic acid, glutaric acid, adipic acid, pimelic acid, suberic acid, azelaic acid, sebacinic acid, maleic acid, fumaric acid, citraconic acid, mesaconic acid, itaconic acid, methylmalonic acid, methylsuccinic acid, hexahydrophthalic acid, methyltetrahydrophthalic acid, glycolic acid, lactic acid, hydroacrylic acid, α-hydroxy-n-butyric acid, α-hydroxyisobutyric acid, β-hydroxy-n-butyric acid, γ-hydroxybutyric acid, 3-hydroxyglutaric acid, 3-hydroxy-3-methylglutaric acid, leucinic acid, tartronic acid, glyceric acid, malic acid, oxalacetic acid, citric acid, tartaric acid, gluconic acid, 3-hydroxy-3-phenylpropionic acid, hydroxyphenylacetic acid, or their intermolecular or intramolecular esters, or anhydrides, acetylacetone, dipivaloylmethane, ethylacetacetate, hexane-2,4-dion, 1-methyl-pentane-2,4-dione, and heptane-3,5-dion, $(C_2H_5O)_3In$, $C_2H_5OIn(CH_3)_2$,

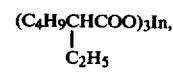

and indium naphthenate,
(f) the organic tin compound free from a photosensitive group in the molecule is at least one compound selected from $(C_4H_9)_2Sn(OCOCH_3)_2$, $(C_4H_9)_2Sn(OCOCH=CHCOO)$, $(C_4H_9)_2Sn(OCOC_{11}H_{23})_2$, $(C_4H_9)_2Sn(OCOCH=CHCOOC_2H_5)_2$, $(C_4H_9)_2Sn[OCOC(CH_3)=CH_2]_2$, $Sn(OC_2H_5)_4$, $Sn(OC_3H_7)_4$, $(CH_3)_2SnCl_2$, $C_4H_9SnOOH$, $CH_3SnOOH$, $(C_4H_9)_3SnF$, and $(C_4H_9)_3SnCl$, the solvent being in a mixing proportion of 80–2% by weight to 20–98% by weight of the organic indium compound (e) or the organic tin compound (f),
(g) the dopant source for the organic and inorganic indium compounds free from a photosensitive group in the molecule is at least one compound selected from the inorganic tin compounds (b) and the organic tin compounds (f), and is contained in a necessary amount for adjusting resistance to a desired value, and the dopant source for the inorganic and organic tin compounds free from a photosensitive group in the molecule is at least one compound selected from $(C_6H_5)_3Sb$, $(p\text{-}CH_3C_6H_4)_3Sb$, $(C_6H_5)$, $SbCl_2$, $(C_2H_5)_3Sb$, $(\text{tert-}C_4H_9)_2SbCl$, $(C_2H_5)_3SbCl$, $(CH_3)_3Sb(OCOCH_3)_2$, $(CH_3)_2Sb(OCOCH_3)_3$,

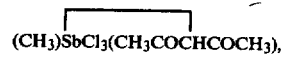

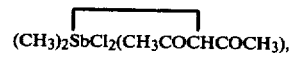

and $Sb(OC_2H_5)_3$,
(h) the glass substrate is irradiated with ultraviolet rays from an ultraviolet lamp with an output of 10 to 160 W/cm at a substrate temperature of 100°–600° C. while keeping the distance between the lamp and the substrate at 10 cm, and ultimately baked in an atmosphere at 300°–600° C., thereby obtaining a transparent electroconductive film.

* * * * *